United States Patent [19]

Luckett et al.

[11] 3,772,607

[45] Nov. 13, 1973

[54] FET INTERFACE CIRCUIT

[75] Inventors: Gary C. Luckett, Wappingers Falls; George Sonoda, Poughkeepsie, both of N.Y.

[73] Assignee: International Business Machines Corporation, Armonk, N.Y.

[22] Filed: Feb. 9, 1972

[21] Appl. No.: 224,718

[52] U.S. Cl. .................................... 330/35, 307/205
[51] Int. Cl. .................................... H03f 3/16
[58] Field of Search .................... 330/35; 307/205, 307/251, 304

[56] References Cited

UNITED STATES PATENTS

| | | | |
|---|---|---|---|
| 3,392,341 | 7/1968 | Burns | 330/35 X |
| 3,434,068 | 3/1969 | Sevin | 330/35 X |
| 3,569,732 | 3/1971 | Christensen | 307/304 X |
| 3,549,911 | 12/1970 | Scott | 307/251 X |

*Primary Examiner*—Roy Lake
*Assistant Examiner*—James B. Mullins
*Attorney*—Theodore E. Galanthay et al.

[57] ABSTRACT

The specification describes an FET circuit for converting bipolar transistor signal levels to field effect transistor (FET) signal levels and includes a capacitor, a signal FET, a load FET and a feedback FET. The feedback FET is connected as a diode between the output of the circuit and the input to the signal FET biasing the input of the signal FET to a predetermined potential level that is slightly in excess of its threshold voltage drop.

4 Claims, 4 Drawing Figures

FET INTERFACE CIRCUIT

1. Field of the Invention

This invention relates to a converter circuit for interfacing between bipolar transistor circuits and field effect transistor circuits. More specifically, this invention relates to such an interfacing converter circuit implemented entirely in field effect transistor (FET) technology.

2. Description of the Prior Art

In the prior art, circuits for interfacing bipolar transistor circuits to field effect transistor circuits and for converting bipolar signal levels to FET signal levels were inevitably comprised of bipolar transistors. Although it was recognized that if the interface circuits were fabricated from FET technology, they could be placed on the same chip with other FET circuits, resulting in advantages in cost and packaging density, such FET interfacing circuits have been unavailable to this time. It was felt that because of the variation in the threshold levels of FET circuits, combined with the low voltage swing of bipolar circuits, interface circuits could not be constructed with FET technology. For example, it is common for the threshold of FET circuits to vary from 0.2 to 1 volt while bipolar circuits have voltage swings as small as 0.7 volts. Thus, since the voltage swing of such bipolar circuits is less than the differences in the threshold voltages of various FET devices, it was impossible to fabricate interface circuits from FET technology.

SUMMARY OF THE INVENTION

Briefly, the present invention provides an interface circuit comprised of three FET devices and a capacitor arranged to convert bipolar transistor signal levels to FET signal levels. The capacitor is connected to the input node and is in effect in series with the intrinsic input capacitance of the circuit. The other end of the capacitor has a common connection with the gate of a signal FET and source of a feedback FET. The signal FET has its source connected to a first potential supply such as ground. A load FET has its source connected to both the signal FET and feedback FET and its drain connected to a second potential supply such as +10 volts. The load FET has its gate and drain interconnected in a diode configuration thereby acting as a variable load resistor to the signal FET.

The output signal is taken from the output node which is formed by a common connection between the three FET's. In essence, the feedback FET provides a feedback path between the output node and the input node to bias the signal FET to a desired voltage level depending on the particular device parameters. Accordingly, it is a primary object of this invention to interface bipolar signal levels with FET signal levels.

A further object of this invention is to overcome the problem of threshold variation in FET circuits.

It is more specifically an object of this invention to implement an interface circuit entirely in FET technology.

Lastly, it is an object of this invention to provide an interface circuit that is adapted to be placed on the same semiconductor chip with other FET circuits.

The foregoing and other objects, features and advantages of this invention will be apparent from the following more particular description of the preferred embodiment of the invention, as illustrated in the accompanying drawings.

DESCRIPTION OF THE PREFERRED EMBODIMENT

Figure 1:
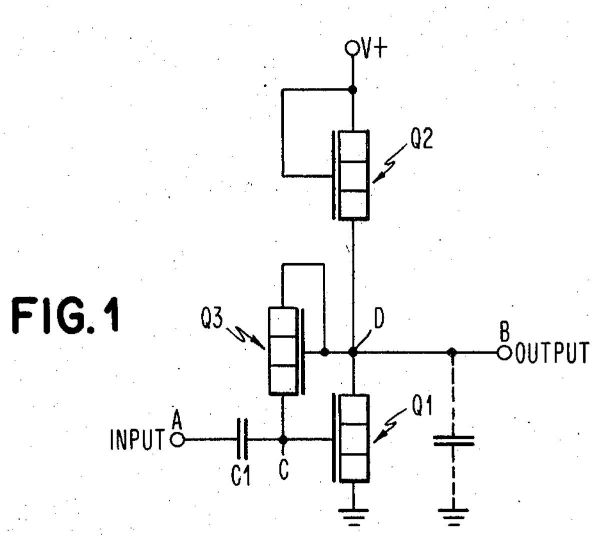
FIG. 1 is a circuit diagram of a preferred embodiment.

Refer now to FIG. 1 which is a circuit diagram depicting the present circuit in its preferred form. The circuit receives an input at node A and provides an output at node B. Capacitor C1 is connected between the input node A and the common connection C of the gate of Q1 and source of Q3. Signal FET Q1 has its source grounded while the drain has a common connection D with both Q2 and Q3. Common connection D of course is the identical point electrically as output node B. Feedback FET Q3 has its drain and gate connected in a diode configuration and in essence operates as a diode. Load FET Q2 also has its gate and drain electrodes interconnected in diode fashion and operate as a variable load resistor. In load FET Q2, this common connection between gate and drain electrode is connected to a positive potential supply +V. The output node B is typically connected to the gate of a subsequent FET which has an input capacitance as depicted by the phantom capacitor.

Operation

In order to simplify the description of the operation of the circuit of FIG. 1, reference will be made to specific component values, as well as voltage and current levels. These are given by way of example and are to be construed as words of description not limitation. It is accordingly assumed that the input signal at node A has two stable voltage levels with a difference of at least 700 millivolts. It may further be assumed that neither of the stable voltage levels are at ground level. In order to eliminate the effect of the DC component at node A and only transfer the actual voltage swing to node C, capacitor C1 is provided. The value of capacitance C1 depends on the intrinsic capacitance of the FET circuit at node C.

It has been found experimentally that for the values used in the present description, a 500 millivolt swing is desired at node C. A capacitance of 1.5 pf's has been found satisfactory. The common connection at node C normally is biased at 500 millivolts above the threshold level of Q1. This results in the common connection D (also output node B) to be at a voltage level equal to the sum of: the threshold levels of Q1 and Q3 and the bias voltage at node C. The actual voltage at common connection D is not only a function of these threshold levels, but also the actual value of voltage +V and the relative size and structure of Q1, Q2, and Q3. In the present example, Q3 is a minimum area device meaning that it occupies as little space on the semiconductor chip that the technology permits for an operable FET or diode. The relative size of Q1 and Q2 is determined by the anticipated input levels, the desired output levels, the actual voltage level of +V as well as other factors. Typically, Q2 is constructed with a higher resistance value than Q1, the two being balanced to obtain the desired bias level at node C.

Figure 2:
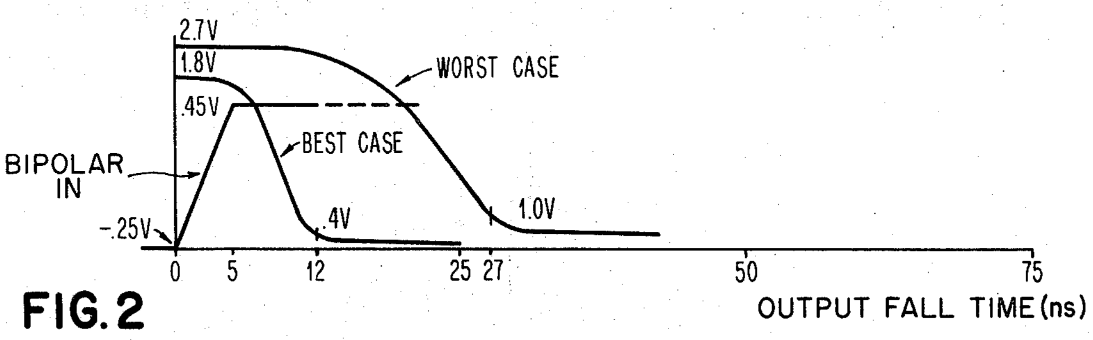
FIG. 2 is a waveform diagram depicting the operation of the circuit of FIG. 1.

In the present example, the potential at +V is approximately 10 volts (+ or − 10 percent). This results in the waveform diagrams illustrated in FIG. 2 and FIG. 3. FIG. 2 illustrates the condition in which the input at node A is at the down level, minus 250 millivolts for example. The output node D then is approximately between 1.8 volts and 2.7 volts depending on the threshold levels of the various devices. Node C is at 500 millivolts above the threshold level of Q1. When the input at node A swings up by 700 millivolts to 0.45 volts, the potential at node C rises to one volt above the threshold of Q1 as previously described. This is sufficient to turn Q1 fully on bringing the common connection at node D and the output node B near the ground level. The threshold levels of the devices in this example varied from 0.2 volts to 1.0 volts from the best case to the worst case. The time delay shown in the curve is essentially the time required to discharge the output capacitor (in phantom) through Q1 to ground.

Figure 3:
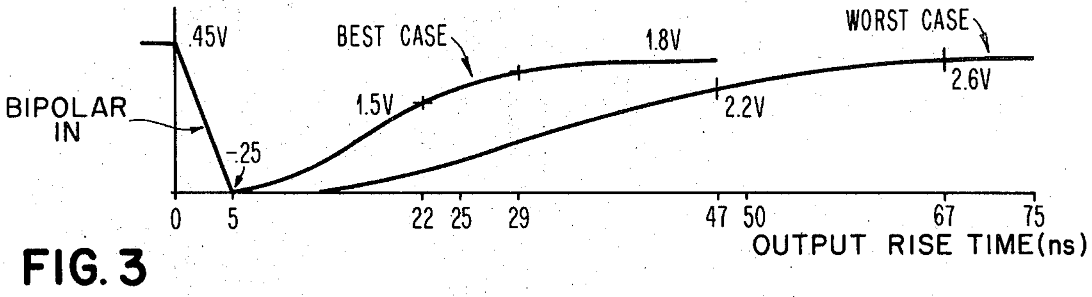
FIG. 3 is also a waveform diagram depicting the operation of the circuit of FIG. 1.

FIG. 3 shows the return of the input at node A to its normal down level. This brings the common connection at node C back to 500 millivolts above the threshold level of Q1, turning Q1 to a much lower current level. This permits the output capacitor (in phantom) to be charged to the up level again through FET Q2. As previously described, the resistance of Q2 is much larger than that of Q1 causing the longer delay as shown in FIG. 3.

Figure 4:
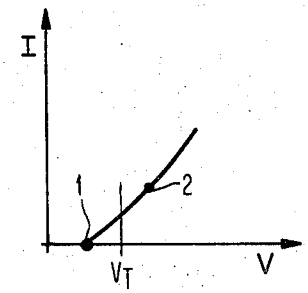
FIG. 4 is a waveform diagram depicting the operation of transistor Q3 in the circuit of FIG. 1.

The waveform of FIG. 4 illustrates the operation of Q3. In the current/voltage plot shown, the range of operation is shown to vary about the threshold voltage of Q3. Thus, when system power is first brought up bringing +V from 0 to 10 volts, the feedback path exemplified by Q3 biases the common connection at node C to a desired level of 500 millivolts, as determined by the design of Q1 and Q2. In the steady state, however, the current through Q2 is equal to the current through Q1 so that current no longer flows through Q3.

The ability of the present circuit to overcome uncontrollable process and dimensional tolerances which cause undesirable variations in threshold voltages is an important feature of the present invention. As process techniques improve, the characteristics of the present circuit improve. In the present example, it was found that threshold voltages can vary from 200 millivolts 1.0 volts. A design criteria for obtaining a meaningful output at node B required that the current through Q1 be in the ratio of at least 4:1 in the on and off conditions. The current through Q1 is obtained by the formula, $I = K (V_G - V_T)^2$. $K$ is a constant determined by the process and dimensions of the devices. $V_G$ is the potential at the gate of Q1 while $V_T$ is the threshold voltage of Q1. If it is assumed that the threshold voltage $V_T$ remains constant in the on and off conditions, then it is seen that increasing $V_G$ from 0.5 to 1.0 results in the necessary 4:1 current ratio. Decreasing the bias voltage would increase the current ratio but would decrease the noise tolerance of the circuit. It is of course clear that a larger input voltage signal swing will greatly enhance the operation of the circuit. The design criteria to be observed at all times is that the output voltage at node B must vary sufficiently to activate the subsequent device connected to node B. Since typically the output signal at node B is supplied to the gate of another FET, this means that with the down level at node A, the potential at node B must be greater than the threshold voltage of the subsequent device. Conversely, when the output at node A is at an up level, the potential at node B must be less than the threshold voltage of the subsequent device. It is assumed that the threshold voltage of the device connected to the output node B will be similar to that of devices Q1, Q2, and Q3. This further enhances the operation of the present circuit.

Those skilled in the art are aware of the fact that threshold voltage varies not only with process and dimensional variations but also with source to substrate bias. Thus, the substrate is biased to some voltage level such as −3 volts for example with respect to the ground potential connected to the source of Q1. Since node C is biased to a potential level higher than ground, as previously described, it follows that the source of Q3 is biased to a different level with respect to the substrate, than is the source of Q1. This difference in source to substrate bias level results in Q3 always having a higher threshold level than Q1 resulting in the typical values illustrated on the waveforms of FIGS. 2 and 3.

In conclusion what has been described is a means Q3 for biasing signal FET Q1 near its threshold level, (regardless of what that threshold level might be) thereby adapting the signal FET Q1 to be switched in response to an input signal voltage that is less than possible variations in its threshold level.

While the invention has been shown and particularly described with reference to a preferred embodiment, it will be understood by those skilled in the art that various changes in form and detail may be made therein without departing from the spirit and scope of the invention. As for example, it would be quite obvious to replace the feedback path illustrated with FET Q3 by a circuit network comprising several FET's, or diodes, etc.

What is claimed is:

1. A self-biasing FET converter circuit for converting low voltage binary signals to higher voltage binary signals, said self-biasing FET converter circuit comprising:

an input node;

an output node;

a signal FET with a first threshold voltage level having two gated electrodes and a gating electrode, and operatively connected to receive a low voltage binary input signal from said input node and providing a converted higher voltage binary output signal at said output node, said signal FET having high and low stable conducting states;

a load FET having a common connection in series with said signal FET, said common connection being operatively connected to said output node; and a feedback FET with a second threshold voltage level being higher than said first threshold voltage level, having a gating electrode and first and second gated electrodes connected as a diode between said input node and said output node, the first gated electrode and said gating electrode being connected to said common connection, the second gated electrode being operatively connected to the gating electrode of said signal FET;

the feedback FET providing a feedback path from the common connection to the gating electrode of the signal FET for biasing the gating electrode of the signal FET to a predetermined potential level, such that when said signal FET is in its low stable conducting state then the potential at its gating electrode differs by one threshold voltage drop from the potential level of the output node, thereby maintaining the potential level at the gating electrode of the signal FET slightly in excess of its threshold voltage drop when said signal FET is in its low stable conducting state.

2. A converter circuit as in claim 1 further comprising:

a capacitor connected between said input node and the second gated electrode of said feedback FET.

3. A circuit as in claim 2 wherein the capacitive value of said series capacitor is greater than the capacitive value of the intrinsic input capacitance of said signal FET.

4. A self-biasing converter circuit as in claim 1 further comprising:

a capacitive load connected to said output node.

* * * * *